(12) United States Patent
Kobayashi

(10) Patent No.: US 12,351,405 B2
(45) Date of Patent: Jul. 8, 2025

(54) OVERHEAD CONVEYING VEHICLE

(71) Applicant: Murata Machinery, Ltd., Kyoto (JP)

(72) Inventor: Makoto Kobayashi, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 306 days.

(21) Appl. No.: 18/036,674

(22) PCT Filed: Sep. 2, 2021

(86) PCT No.: PCT/JP2021/032284
§ 371 (c)(1),
(2) Date: May 12, 2023

(87) PCT Pub. No.: WO2022/107415
PCT Pub. Date: May 27, 2022

(65) Prior Publication Data
US 2023/0416018 A1 Dec. 28, 2023

(30) Foreign Application Priority Data

Nov. 17, 2020 (JP) ................................. 2020-190779

(51) Int. Cl.
*B65G 47/00* (2006.01)
*B65G 47/90* (2006.01)

(52) U.S. Cl.
CPC .................................. *B65G 47/90* (2013.01)

(58) Field of Classification Search
CPC ... B65G 47/90; B65G 49/07; H01L 21/67733; H01L 21/67775; H01L 21/6773; H01L 21/67259; H01L 21/677; B66C 1/30; B66C 1/10; B66C 5/06; B66C 17/06; B66C 17/12
See application file for complete search history.

(56) References Cited

U.S. PATENT DOCUMENTS

| | | | | |
|---|---|---|---|---|
| 2006/0169663 | A1* | 8/2006 | Nakao | B66C 1/28 212/319 |
| 2020/0013652 | A1 | 1/2020 | Kobayashi | |
| 2020/0269882 | A1* | 8/2020 | Kobayashi | B65G 1/0457 |

FOREIGN PATENT DOCUMENTS

| | | | | | |
|---|---|---|---|---|---|
| CN | 101353109 | A | * | 1/2009 | ............ B65G 37/02 |
| JP | 2006-8354 | A | | 1/2006 | |
| JP | 2008263004 | A | * | 10/2008 | |
| JP | 2014-076729 | A | | 5/2014 | |
| JP | 2016-163001 | A | | 9/2016 | |

(Continued)

OTHER PUBLICATIONS

International Search Report dated Nov. 9, 2021 in counterpart International Application No. PCT/JP2021/032284.

(Continued)

*Primary Examiner* — Emmanuel M Marcelo
(74) *Attorney, Agent, or Firm* — DLA Piper LLP (US)

(57) ABSTRACT

An overhead transport vehicle includes a lifting platform configured to transfer a container, a container contact portion configured to come into contact with a top surface of the container and movably provided along a height direction with respect to the lifting platform, and a height detecting unit configured to detect a relative height position of the container contact portion with respect to the lifting platform. The container contact portion is movably provided along the horizontal direction with respect to the lifting platform.

9 Claims, 8 Drawing Sheets

(56) References Cited

FOREIGN PATENT DOCUMENTS

| JP | 2018193169 A | * | 12/2018 | | |
|---|---|---|---|---|---|
| JP | 6607314 B2 | * | 11/2019 | ............ | H01L 21/673 |
| KR | 20150116387 A | * | 10/2015 | ............. | B65G 47/90 |
| WO | 2018/179931 A1 | | 10/2018 | | |

OTHER PUBLICATIONS

Written Opinion dated Nov. 9, 2021 in counterpart International Application No. PCT/JP2021/032284.

* cited by examiner

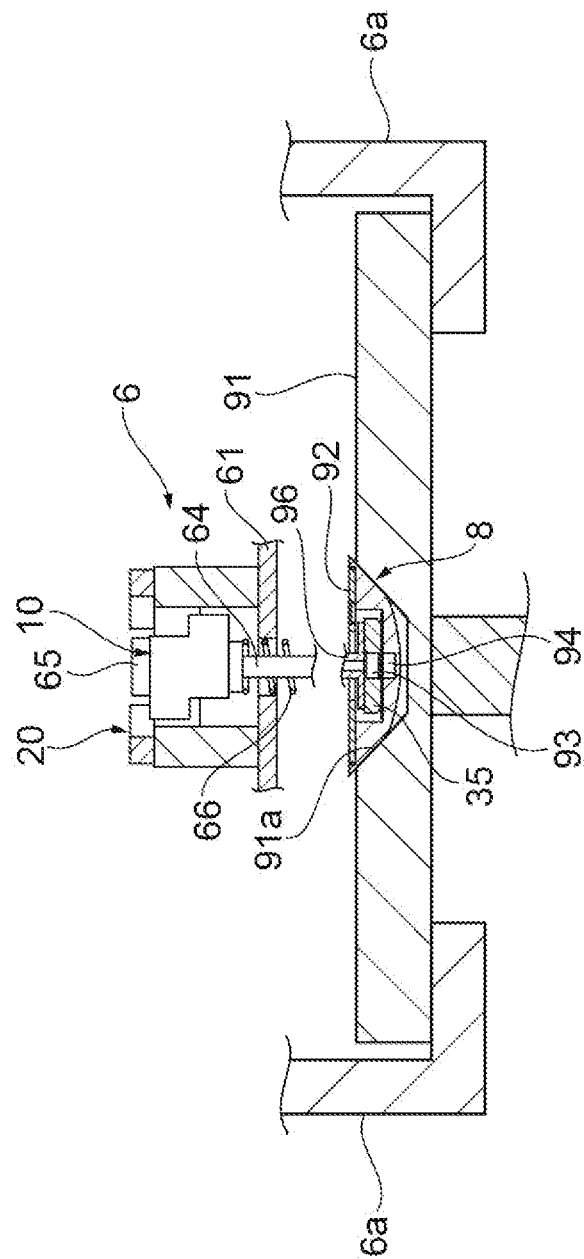
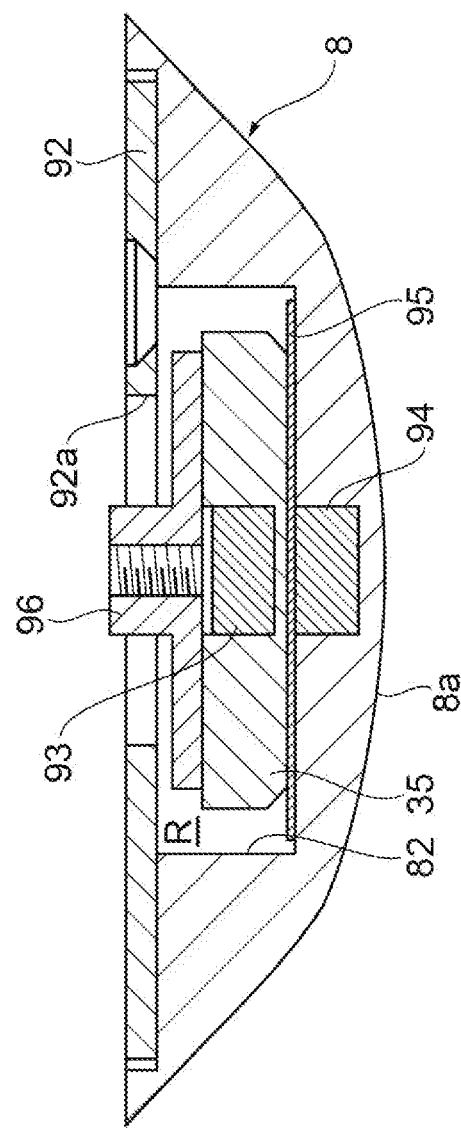
Fig.5 (a)
Fig.5 (b)

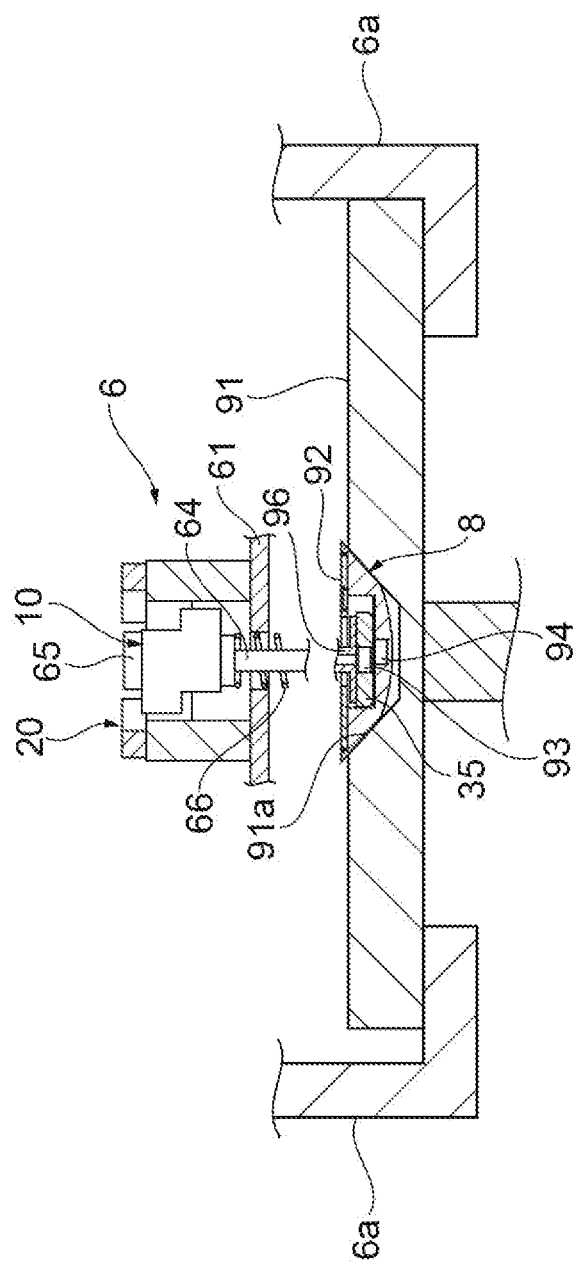
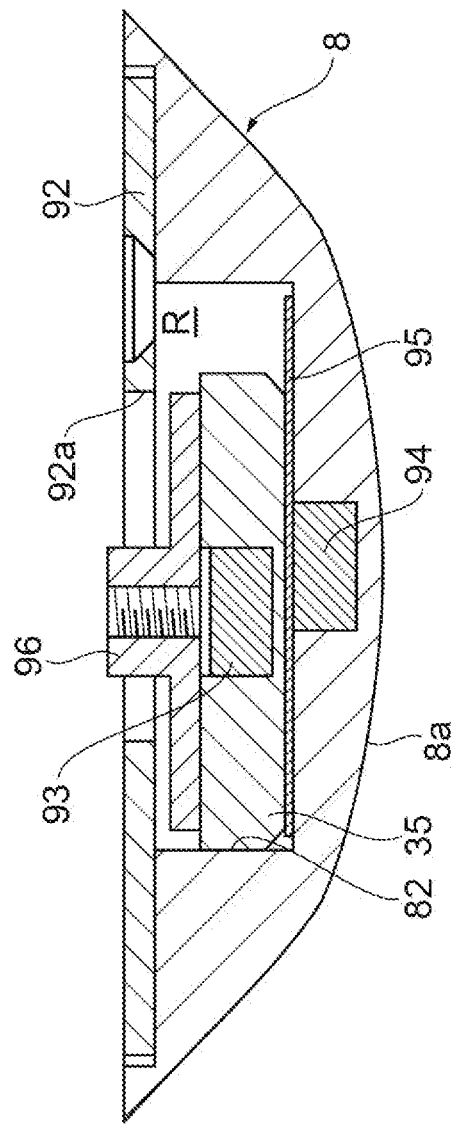
Fig.6 (a)
Fig.6 (b)

OVERHEAD CONVEYING VEHICLE

TECHNICAL FIELD

This disclosure relates to an overhead transport vehicle.

BACKGROUND

International Publication No. WO 2018/179931 describes an overhead transport vehicle including a lifting platform (holding portion) configured to transfer a container and a container contact portion (positioning portion) provided on the lifting platform and configured to come into contact with a top surface of the container. In the overhead transport vehicle described in WO '931, the container contact portion is movably provided in a height direction with respect to the lifting platform, and a relative height position of the container contact portion with respect to the lifting platform is detected by a height detecting unit (detecting unit).

In the overhead transport vehicle described above, when a container is transferred with the lifting platform, if the container is shifted horizontally, the container contact portion in contact with the top surface of the container may possibly move in the height direction (for example, due to a projection, a recess, or tilt of the top surface of the container, this shift may possibly be converted into movement in the height direction of the container contact portion). Thus, it is difficult to accurately determine the height position of the container contact portion by the height detecting unit.

It could therefore be helpful to provide an overhead transport vehicle in which the relative height position of the container contact portion with respect to the lifting platform can be accurately determined.

SUMMARY

An overhead transport vehicle includes: a lifting platform configured to transfer a container; a container contact portion configured to come into contact with a top surface of the container and movably provided along a height direction to the lifting platform; and a height detecting unit configured to detect a relative height position of the container contact portion with respect to the lifting platform. The container contact portion is movably provided along a horizontal direction with respect to the lifting platform.

In this overhead transport vehicle, if the container is shifted in the horizontal direction, the container contact portion is able to move in the horizontal direction in accordance with the shift. Resultantly, it is possible to prevent the shift from being converted into movement of the container contact portion in the height direction. Therefore, it is possible to accurately determine the relative height position of the container contact portion with respect to the lifting platform.

The container contact portion may be a positioning portion configured to fit into a recess formed in the top surface of the container. Thus, with the container contact portion, it is possible to position the lifting platform to the container.

The overhead transport vehicle may include a sliding member attached to the lifting platform and slidable along the horizontal direction with respect to the container contact portion, in which the container contact portion may include a housing space housing the sliding member. As a result, it is possible to practically achieve a configuration in which the container contact portion is movable along the horizontal direction with respect to the lifting platform.

The overhead transport vehicle may include an energizing portion configured to energize the container contact portion such that the sliding member is positioned in a predetermined position in the housing space. As a result, for example, during an unloaded state when the container contact portion is not in contact with the top surface of the container, it is possible to maintain constant a position of the container contact portion with respect to the lifting platform.

The energizing portion may include a first magnet provided in the sliding member and a second magnet provided in the container contact portion. In an example, using the magnetic force of the first magnet and the second magnet, it is possible to maintain constant the position of the container contact portion with respect to the lifting platform.

The overhead transport vehicle may further include a lid member, in which the housing space is demarcated by opening portion provided in the container contact portion and opened upward, and the lid member partially closes the opening of the opening portion. Thus, with the lid member, it is possible to prevent the sliding member from slipping out the housing space.

A sheet member having friction coefficient smaller than that of the container contact portion may be provided between the container contact portion and the sliding member. Thus, for example, in a state where the container contact portion is in contact with the top surface of a container and the container is shifted in the horizontal direction, the sheet member allows the sliding member and the container contact portion to slide to each other more easily. As a result, it is possible to prevent the upper surface of the container and the container contact portion from sliding to each other, thereby preventing damage to the top surface of the container.

The container contact portion may come into contact with the top surface of the container with a friction member interposed between the container contact portion and the top surface of the container, the friction member having friction coefficient higher than that of the container contact portion. As a result, for example, when the container contact portion is in contact with the top surface of the container, if the container is shifted in the horizontal direction, the friction member is able to prevent the top surface of the container and the container contact portion from sliding to each other, thereby preventing damage to the top surface of the container.

The container contact portion may be movable with respect to the lifting platform in a first direction along the horizontal direction, and in a second direction along the horizontal direction and orthogonal to the first direction. As a result, when the container is shifted not only in the first direction along the horizontal direction but also in the second direction, the container contact portion is able to move in the horizontal direction in accordance with the shift.

It is thus possible to provide an overhead transport vehicle in which the relative height position of the container contact portion with respect to the lifting platform can be accurately determined.

BRIEF DESCRIPTION OF THE DRAWINGS

FIG. 5(a) is a sectional view illustrating the peripheral configuration around the center cone in FIG. 1 under normal conditions. FIG. 5(b) is a sectional view illustrating an enlarged part of FIG. 5(a).

FIG. 6(a) is a sectional view illustrating the peripheral configuration around the center cone in FIG. 1 when the FOUP is shifted in a horizontal direction. FIG. 6(b) is a sectional view illustrating an enlarged part of FIG. 6(a).

Figure 1:
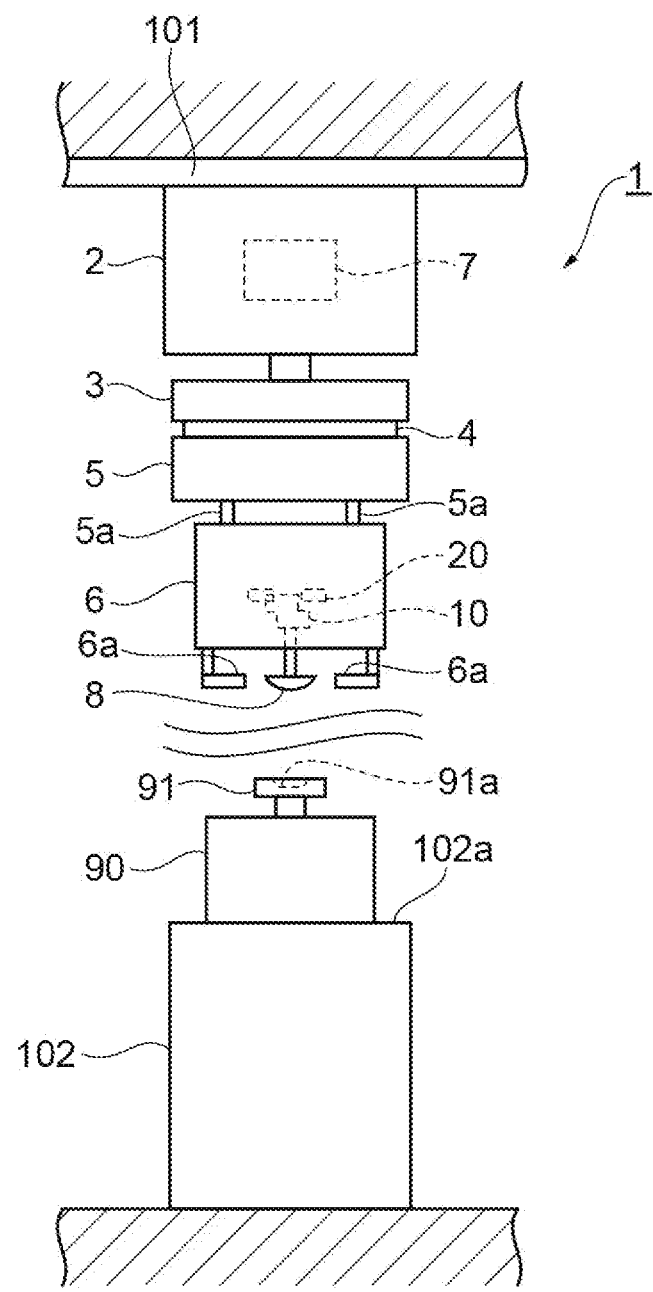
FIG. 1 is a front view illustrating an overhead transport vehicle according to a first example.

REFERENCE SIGNS LIST 1, 100 overhead transport vehicle
6 lifting platform
8 center cone (container contact portion)
20 height detecting unit
35 sliding member
82 opening portion
90 FOUP (container)
91a recess
92 lid member
93 first magnet (energizing portion)
94 second magnet (energizing portion)
95 sheet member
105 friction member
108 center pad (container contact portion)
190 POD (container)
191 top surface
R housing space

DETAILED DESCRIPTION

Examples will now be described in detail with reference to the drawings. In the drawings, like or equivalent elements are designated by like reference signs, and duplicate description is omitted.

First Example

A first example will now be described. As illustrated in FIG. 1, an overhead transport vehicle 1 according to a first example travels along a traveling rail 101 laid near a ceiling of a clean room where semiconductor devices are manufactured. The overhead transport vehicle 1 conveys a FOUP (container) 90 in which a plurality of semiconductor wafers are housed. The overhead transport vehicle 1 transfers the FOUP 90 to a load port (transfer destination) 102 provided in a processing apparatus configured to provide various types of processing on the semiconductor wafers. In other words, the overhead transport vehicle 1 collects the FOUPs 90 disposed on a loading surface 102a of the load port 102 or disposes the FOUPs 90 on the loading surface 102a of the load port 102.

The overhead transport vehicle 1 includes a traveling unit 2, a lateral unit 3, a theta unit 4, a lifting drive unit 5, a lifting platform 6, and a control unit 7. The traveling unit 2, for example, travels along the traveling rail 101 by receiving supply of electric power in a contactless manner from a high-frequency current line laid along the traveling rail 101. The lateral unit 3 moves the theta unit 4, the lifting drive unit 5, and the lifting platform 6 in a transverse direction to a direction in which the traveling rail 101 extends. The theta unit 4 rotates the lifting drive unit 5 and the lifting platform 6 within a horizontal plane.

The lifting drive unit 5 raises or lowers (moves in the height direction) the lifting platform 6 by unrolling or winding a plurality of belts 5a to which the lifting platform 6 is attached at a lower end thereof. The lifting platform 6 transfers the FOUP 90. The lifting platform 6 holds or releases the flange 91 included in the FOUP 90 by opening or closing the pair of claw members 6a. The control unit 7 controls operations of respective parts of the overhead transport vehicle 1.

The overhead transport vehicle 1 further includes a center cone 8, a dog 10, and a height detecting unit 20. The center cone 8 is a container contact portion to come into contact with the top surface of the FOUP 90. The center cone 8 is a positioning portion configured to fit into a recess 91a formed in a top surface of the flange 91, for positioning of the lifting platform 6 with respect to the FOUP 90. The center cone 8 is positioned in the center of the lifting platform 6 when viewed from below, and constitutes a centering member positioning (centering) a center position of the lifting platform 6 with respect to the FOUP 90. The center cone 8, the dog 10, and the height detecting unit 20 are provided on the lifting platform 6.

Figure 2:
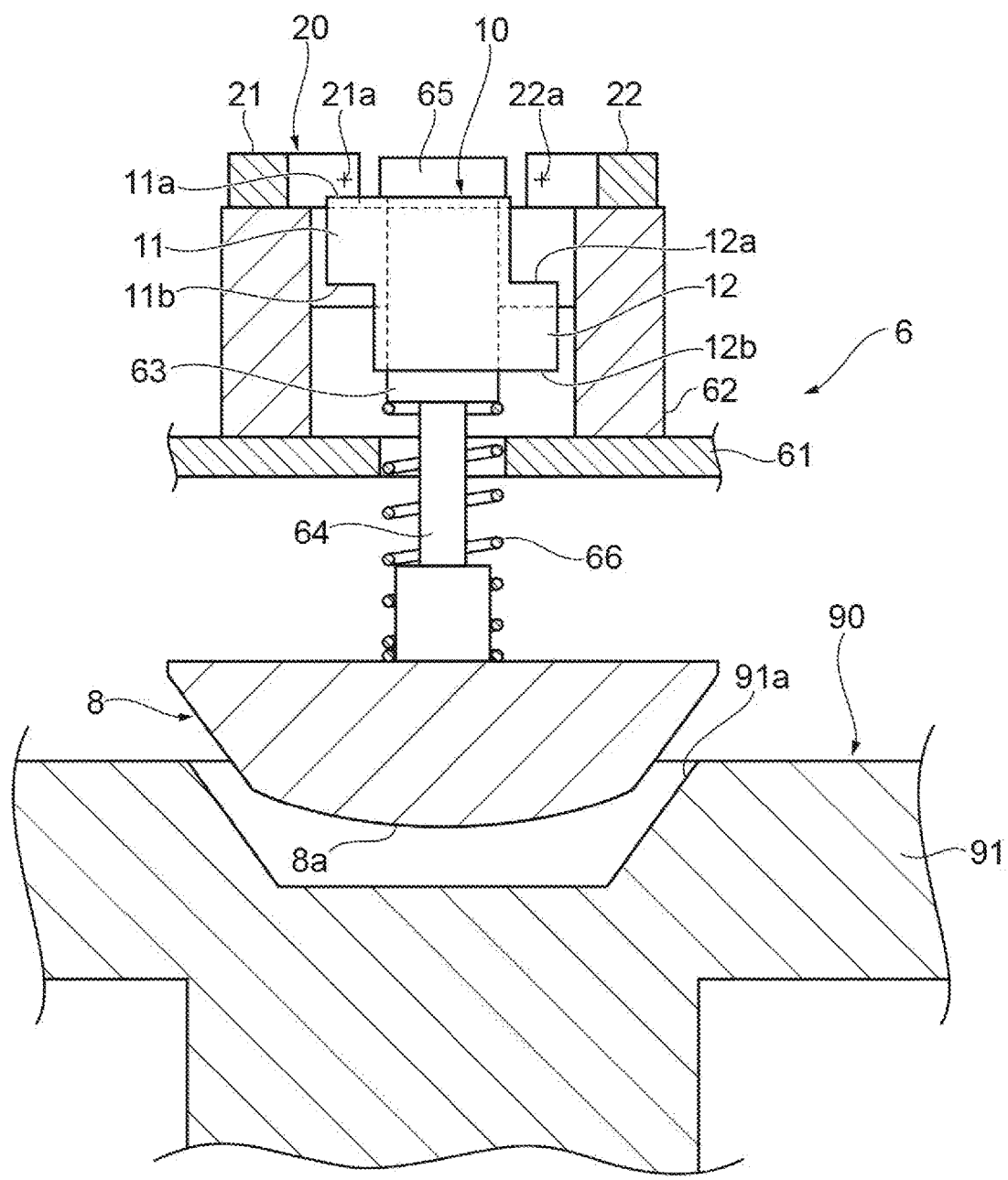
FIG. 2 is a sectional view illustrating a peripheral configuration around a center cone in FIG. 1.
Figure 3:
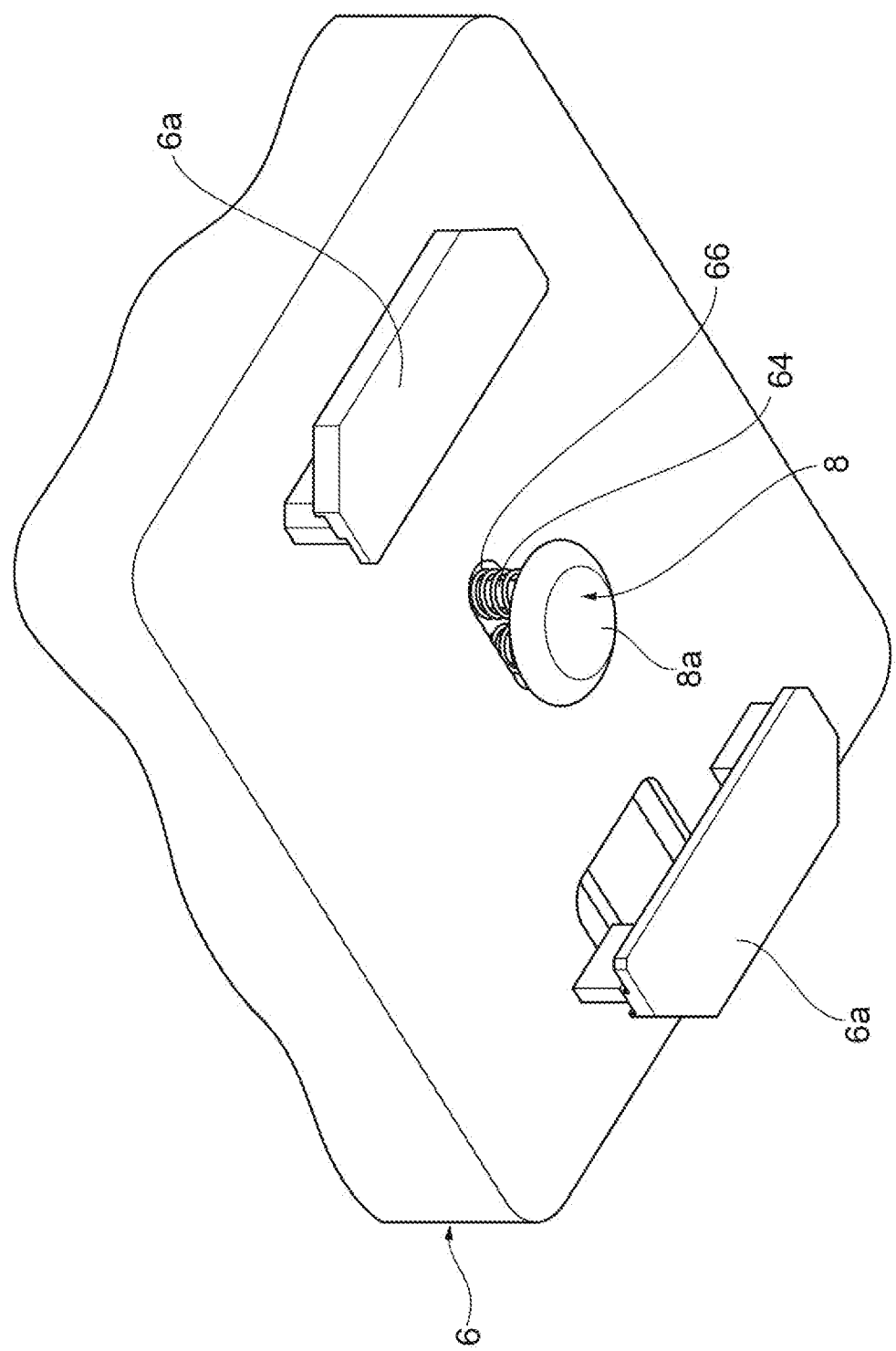
FIG. 3 is a downward perspective view illustrating the lifting platform in FIG. 1.

As illustrated in FIGS. 2 and 3, the center cone 8, the dog 10, and the height detecting unit 20 are supported by a support member 62 provided on a base 61 of the lifting platform 6. A pair of guides 63 are fixed to the support member 62. Each of the guides 63 is a cylindrical member extending in a vertical direction. A rod 64 is inserted into each of the guides 63. Respective upper ends of the rods 64 are connected to each other by a connecting member 65. The center cone 8 is attached to lower ends of the rods 64. Coil springs 66 are disposed between the center cone 8 and the respective guides 63, the rods 64 being inserted into the coil springs 66. A pair of coil springs 66 energizes the center cone 8 to the lower side from the support member 62.

With the foregoing configuration, the center cone 8, the rods 64, and the connecting member 65 are movable along the height direction (up and down directions and rising and lowering directions) with respect to the lifting platform 6, assuming that an initial position is a position at which the connecting member 65 comes into contact with an upper end of each of the guides 63. In other words, the center cone 8, the rods 64, and the connecting member 65 are vertically movable with respect to the lifting platform 6.

As illustrated in FIG. 2, the dog 10 includes a first light shielding plate 11 and a second light shielding plate 12. The first light shielding plate 11 and the second light shielding plate 12 are integrally formed of, for example, a metal plate, and are fixed to the connecting member 65. As a result, the first light shielding plate 11 and the second light shielding plate 12 are vertically movable corresponding to relative rising-and-lowering operations of the center cone 8 with respect to the lifting platform 6. The first light shielding plate 11 has a first upper end 11a and a first lower end 11b parallel to the horizontal direction. The second light shielding plate 12 has a second upper end 12a and a second lower end 12b parallel to the horizontal direction. A distance between the first upper end 11a and the first lower end 11b is equal to a distance between the second upper end 12a and the second lower end 12b. The first lower end 11b and the second upper end 12a are positioned at the same height (same position in the vertical direction).

The height detecting unit 20 includes a first photo interrupter 21 and a second photo interrupter 22. The first photo interrupter 21 is attached to the support member 62 such that the first light shielding plate 11 can pass on an optical axis 21a (between a light emitting portion and a light receiving portion of the first photo interrupter 21) of the first photo interrupter 21. As a result, the first photo interrupter 21 is capable of detecting a position of the first light shielding plate 11. The second photo interrupter 22 is attached to the support member 62 such that the second light shielding plate 12 can pass on an optical axis 22a (between a light emitting portion and a light receiving portion of the second photo interrupter 22) of the second photo interrupter 22. As a result, the second photo interrupter 22 is capable of detecting a position of the second light shielding plate 12. The optical axis 21a of the first photo interrupter 21 and the optical axis 22a of the second photo interrupter 22 are positioned at the same height (same position in the vertical direction). With the center cone 8 in an initial position thereof (that is, a position at which the connecting member 65 comes into contact with the upper end of each of the guides 63), the first upper end 11a of the first light shielding plate 11 is positioned on the lower side from the optical axis 21a of the first photo interrupter 21.

As described above, the first light shielding plate 11 and the second light shielding plate 12, which constitute the dog 10, are vertically movable corresponding to the relative rising-and-lowering operations of the center cone 8 with respect to the lifting platform 6. The first photo interrupter 21 and the second photo interrupter 22, which constitute the height detecting unit 20, are respectively capable of detecting the positions of the first light shielding plate 11 and the second light shielding plate 12 (ON/OFF of the output from the respective light receiving portions of the first photo interrupter 21 and the second photo interrupter 22). In other words, the height detecting unit 20 detects the relative height position of the center cone 8 with respect to the lifting platform 6 by detecting the position of the dog 10. As a result, based on the relative height position of the center cone 8 with respect to the lifting platform 6, the control unit 7 recognizes, for example, whether the FOUP 90 is present at the load port 102, whether the lifting platform 6 has reached the holding position, and whether the lifting platform 6 is holding the flange 91 of the FOUP 90.

Next, the peripheral configuration around the center cone 8 is described in detail.

Figure 4:
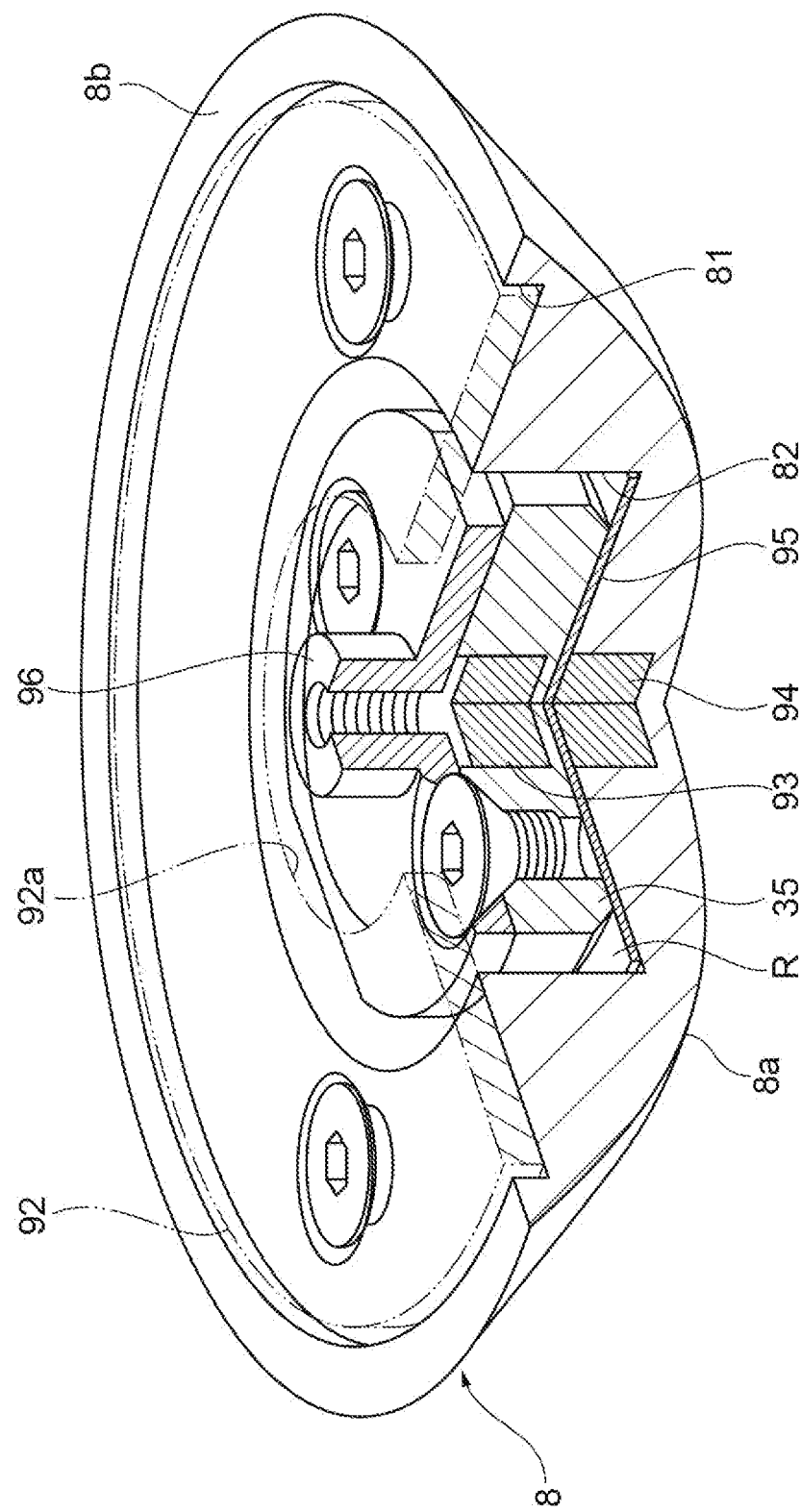
FIG. 4 is a partial perspective sectional view illustrating the peripheral configuration around the center cone in FIG. 1.

As illustrated in FIGS. 4, 5(a) and 5(b), the overhead transport vehicle 1 has the center cone 8, a sliding member 35, a lid member 92, a first magnet 93, a second magnet 94, and a sheet member 95. The center cone 8 has a convex outer form on a lower side thereof and includes a lower surface 8a of a parabolic shape. The center cone 8 is formed of a non-magnetic material, for example, formed of resin. The top surface 8b of the center cone 8 has a step 81 formed by being recessed except at an edge of the top surface 8b. In a bottom surface of the step 81, an opening portion 82 opened upward is formed at a position including a center of the center cone 8 in upward view. The opening portion 82 has a circular shape that is concentric with the center cone 8 in upward view. The sliding member 35 is housed in the opening portion 82. The opening portion 82 demarcates a housing space R housing the sliding member 35.

The sliding member 35 is member having a cylindrical shape. The sliding member 35 is formed of a non-magnetic material, for example, formed of resin. The sliding member 35 is fixed to an unillustrated connecting member connecting the lower ends of the rods 64 (see FIG. 2) with a fixed flange 96 formed of stainless steel, for example, interposed between the sliding member 35 and the connecting member. As a result, the sliding member 35 is attached to the lifting platform 6. The sliding member 35 is disposed in the opening portion 82 (housing space R), as described above. The diameter of the sliding member 35 is smaller than that of the diameter of the opening portion 82. The thickness of the sliding member 35 is less than the depth of the opening portion 82. The sliding member 35 is slidable (movable) along the horizontal direction with respect to the center cone 8 in the housing space R.

The lid member 92 is a member partially closing the opening of the opening portion 82. The lid member 92 is a member having a disc shape and a hole 92a at a center thereof. The lid member 92 is formed of a non-magnetic material, for example, formed of resin. The lid member 92 is disposed in the step 81 in a state of being coaxial with the center cone 8 and is fixed to the center cone 8. The lid member 92 closes the periphery of the opening of the opening portion 82. A part of the fixing flange 96 fixed to the sliding member 35 is inserted into the hole 92a. The lid member 92 demarcates the housing space R housing the sliding member 35.

The first magnet 93 is a member having a cylindrical shape. The first magnet 93 is formed of neodymium, for example. The first magnet 93 is buried in a center of the sliding member 35. The second magnet 94 is a member having a cylindrical shape. The second magnet 94 is formed of neodymium, for example. The second magnet 94 is buried in a center at the bottom surface of the center cone 8. The second magnet 94 has a magnetic pole different from that of the first magnet 93. As a result, an attracting force (attractive force) is exerted between the first magnet 93 and the second magnet 94. The first magnet 93 and the second magnet 94 constitute the energizing portion configured to energize the center cone 8 such that the sliding member 35 is positioned in the center (predetermined position) in the housing space R.

The sheet member 95 is provided between the center cone 8 and the sliding member 35. The sheet member 95 is a member shaped in a circular sheet having friction coefficient smaller than that of the center cone 8. The sheet member 95 is laid on a bottom surface of the opening portion 82.

In this configuration of the example, during an unloaded state when there is no contact with the flange 91 of the FOUP 90, the attractive force between the first magnet 93 and the second magnet 94 allows the center cone 8 to be automatically aligned to maintain the center position (return to the center position) where the center cone 8 is coaxial with the sliding member 35. In this state, the center cone 8 is movable in the first direction along the horizontal direction and in the second direction along the horizontal direction and orthogonal to the first direction, with respect to the sliding member 35 and the lifting platform 6 to which the sliding member 35 is attached. In other words, the center cone 8 is movable (horizontally movable) in any direction, in the horizontal direction with respect to the lifting platform 6 by a fixed amount (a difference between the radius of the housing space R and the radius of the sliding member 35).

Next, the operation of holding the FOUP 90 by a pair of claw members 6a of the lifting platform 6 is exemplified.

The lifting platform 6 is lowered and the center cone 8 is fitted into the recess 91a of the flange 91. When the lifting platform 6 reaches the holding position, lowering of the lifting platform 6 is stopped. The pair of claw members 6a close and the pair of claw members 6a each advance under the flange 91. The lifting platform 6 is then raised, the pair of claw members 6a that have each advanced under the flange 91 and the lower surface of the flange 91 come into contact with each other, and the FOUP 90 is lifted. As a result, as illustrated in FIG. 5(a), the FOUP 90 is held. In normal conditions, a clearance of about 1 mm, for example, is provided between each of the claw members 6a and the flange 91 in the horizontal direction. In normal operations, as illustrated in FIG. 5(b), the center cone 8 comes into contact with the bottom surface of the opening portion 82 with the sheet member 95 interposed between the center cone 8 and the bottom surface, and is positioned in the center position coaxial with the sliding member 35.

At this time, as illustrated in FIG. 6(a), some force may possibly be applied to the FOUP 90, causing the flange 91 to be shifted in the horizontal direction, for example, by the clearance between the claw member 6a and the flange 91. In this regard, as described above, this example has a structure slidable along the horizontal direction in the center cone 8, that is, the center cone 8 is movable in the horizontal direction with respect to the sliding member 35 (lifting platform 6). Therefore, when the shift occurs, the center cone 8 slides in the horizontal direction with respect to the sliding member 35 and moves in the horizontal direction together with the flange 91 to follow the movement of the flange 91. Resultantly, it is possible to maintain the center cone 8 being fitted into the recess 91a as it is, thereby preventing the center cone 8 from riding up out of the recess 91a or preventing the center cone 8 from descending toward the inside of the recess 91a.

As in the foregoing, with the overhead transport vehicle 1 of this example, when the FOUP 90 is shifted in the horizontal direction, the center cone 8 is able to move in the horizontal direction in accordance with the shift. Resultantly, it is possible to prevent the shift from being converted into the movement in the height direction of the center cone 8. Therefore, with the height detecting unit 20, it is possible to accurately determine the relative height position of the center cone 8 with respect to the lifting platform 6. By allowing the center cone 8 to follow the horizontal movement of the flange 91, it is possible to prevent false detection of the height detecting unit 20. In addition, it is possible to reduce vibration transmission through the center cone 8 in the horizontal direction. In addition, it is possible to prevent the top surface of the flange 91 and the center cone 8 from sliding to each other, thereby preventing damage (rubbing) to the top surface of the flange 91.

In the overhead transport vehicle 1, the center cone 8 is a positioning portion configured to fit into a recess 91a formed in the top surface of the flange 91 of the FOUP 90. In this example, with the center cone 8, it is possible to position the lifting platform 6 to the FOUP 90.

The overhead transport vehicle 1 includes the sliding member 35 attached to the lifting platform 6 and slidable along the horizontal direction to the center cone 8. The center cone 8 includes the housing space R housing the sliding member 35. As a result, it is possible to concretely implement a configuration in which the center cone 8 is movable along the horizontal direction with respect to the lifting platform 6.

The overhead transport vehicle 1 includes the first magnet 93 and the second magnet 94 as energizing portions configured to energize the center cone 8 so that the sliding member 35 is positioned in the center of the housing space R. As a result, for example, during an unloaded state when the center cone 8 is not in contact with the top surface of the flange 91, it is possible to maintain constant the position of the center cone 8 with respect to the lifting platform 6. It is thus possible to automatically align the center cone 8 to maintain the center position that is coaxial with the sliding member 35. In addition, since the first magnet 93 and the second magnet 94 are provided as the energizing portions using the magnetic force of the first magnet 93 and the second magnet 94, it is possible to maintain constant the position of the center cone 8 with respect to the lifting platform 6. When the overhead transport vehicle 1 is traveling without loading, it is possible to prevent the occurrence of abnormal noise.

The overhead transport vehicle 1 includes the lid member 92 partially closes the opening of the opening portion 82 demarcating the housing space R. In this example, with the lid member 92, it is possible to prevent the sliding member 35 from slipping out the housing space R.

In the overhead transport vehicle 1, the sheet member 95 having friction coefficient smaller than that of the center cone 8 is provided between the center cone 8 and the sliding member 35. For example, in a state where the center cone 8 is in contact with the top surface of the flange 91, and the flange 91 is shifted in the horizontal direction, the sheet member 95 allows the sliding member 35 and the center cone 8 to slide to each other more easily. As a result, it is possible to prevent the top surface of the flange 91 and the center cone 8 from sliding to each other. Thus it is possible to prevent damage to the top surface of the flange 91.

In the overhead transport vehicle 1, the center cone 8 is movable with respect to the lifting platform 6 in the first direction along the horizontal direction and in the second direction along the horizontal direction and orthogonal to the first direction. As a result, when the flange 91 is shifted not only in the second direction but also in the first direction along the horizontal direction, the center cone 8 is able to move in the horizontal direction in accordance with the shift.

Second Example

A second example will now be described. In the description of this example, the points that differ from the first example will be explained, and redundant explanations will be omitted.

Figure 7:
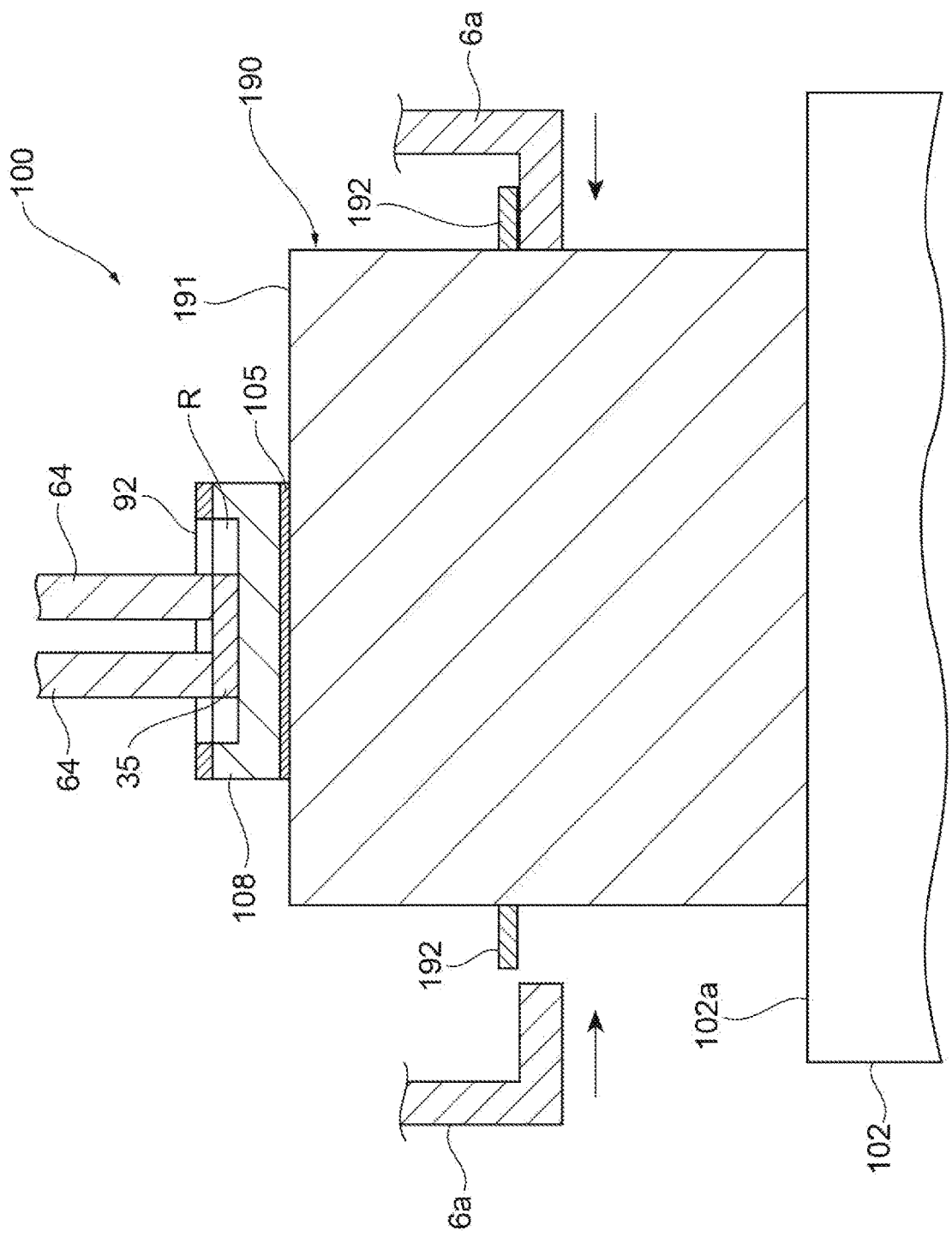
FIG. 7 is a schematic sectional view illustrating the peripheral configuration around the center cone according to a second example.
Figure 8:
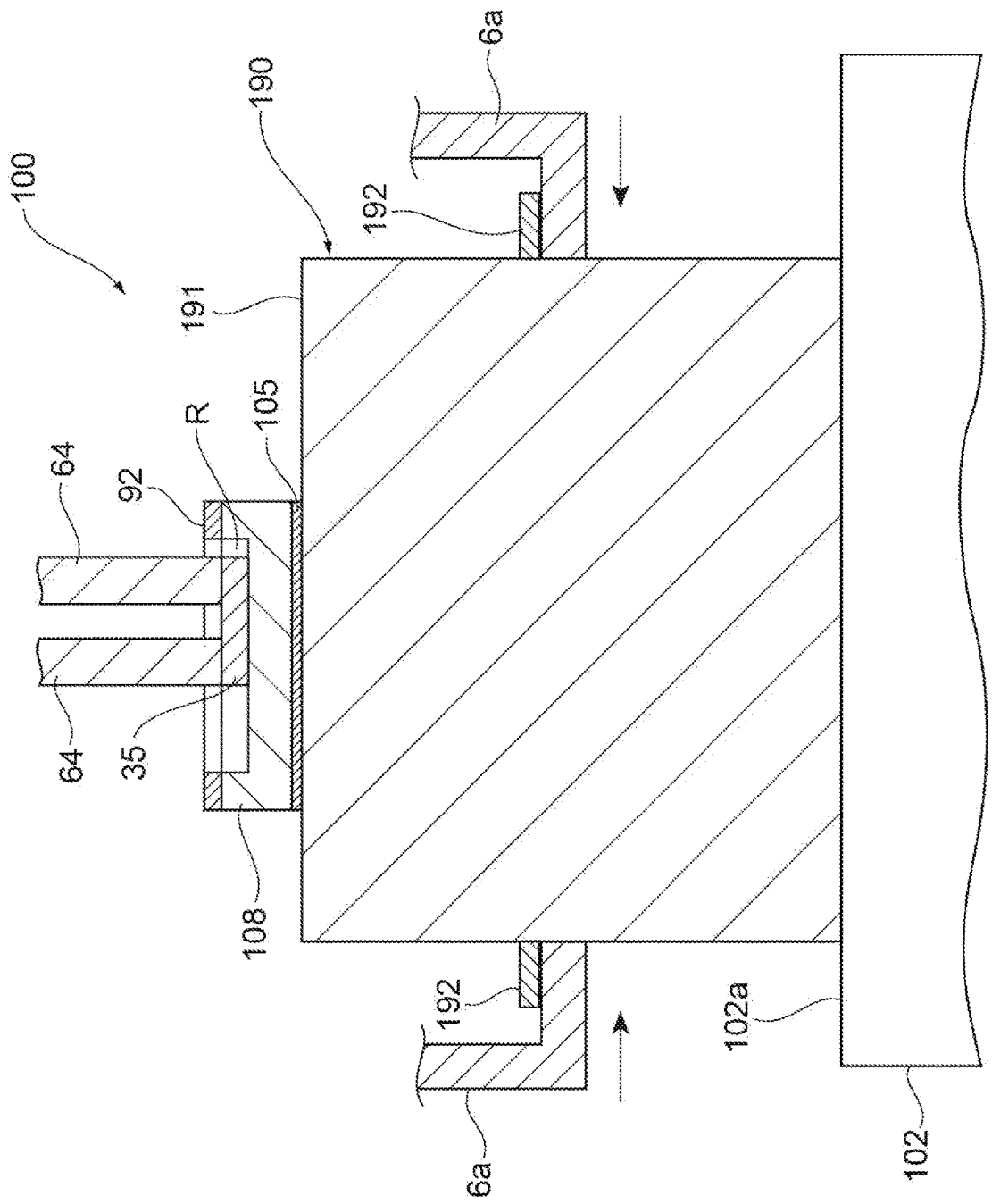
FIG. 8 is a schematic sectional view of the peripheral configuration around the center cone in FIG. 7 when the POD is shifted in the horizontal direction.

As illustrated in FIGS. 7 and 8, an overhead transport vehicle 100 according to the second example differs from the first example in that the overhead transport vehicle 100 according to the second example uses a POD 190 as a container and includes a center pad 108 as a container contact portion instead of the center cone 8 (see FIG. 2). The center pad 108 has a cylindrical outer form and includes a lower surface 108a having a flat shape. The center pad 108 comes into contact with a top surface 191 having a flat shape of the POD 190. On the lower surface 108a of the center pad 108 is provided with a friction member 105 formed in a sheet shape having friction coefficient higher than that of the center pad 108. The center pad 108 comes into contact with the top surface 191 of the POD 190 with the friction member 105 interposed between the center pad 108 and the top surface 191. The friction member 105 is formed of, for example, urethane rubber.

In this example, when the POD 190 is held by the pair of claw members 6a, after the lifting platform 6 is lowered and the center pad 108 comes into contact with the top surface 191 of the POD 190, the pair of claw members 6a close, and the pair of claw members 6a each advance under flanges 192 on side surfaces of the POD 190. The lifting platform 6 is raised and the POD 190 is lifted by the pair of claw members 6a with the flanges 192.

As illustrated in FIG. 7, for example, when the pair of claw members 6a close, the claw members 6a may come into contact with the POD 190. In this example, a configuration of a typical overhead transport vehicle may result in an error with the pair of claw members 6a not closing fully or the center pad 108 rubbing against the top surface 191. In this regard, in this example, the center pad 108 has a structure slidable along the horizontal direction in the center pad 108, that is, the center pad 108 is movable in the horizontal direction with respect to the sliding member 35 (lifting platform 6). Therefore, as illustrated in FIG. 8, when the pair of claw members 6a close, if the claw member 6a comes into contact with the POD 190, as the POD 190 is pushed and shifted in the horizontal direction by the claw member 6a, the center pad 108 slides in the horizontal direction with respect to the sliding member 35, and moves in the horizontal direction together with the POD 190 to follow the movement of the POD 190. Resultantly, it is possible to maintain the center pad 108 and the top surface 191 of the POD 190 being in contact with each other without causing the center pad 108 and the top surface 191 to slide to each other.

As described above, in the overhead transport vehicle 100 of this example, also it is possible to accurately determine the relative height position of the center pad 108 with respect to the lifting platform 6. In addition, it is possible to prevent the top surface 191 of the POD 190 and the center pad 108 from sliding to each other, thereby preventing damage (rubbing) to the top surface 191 of the POD 190.

In the overhead transport vehicle 100, the center pad 108 is in contact with the top surface 191 of the POD 190 with the friction member 105 interposed between the center pad 108 and the top surface 191, the friction member 105 having friction coefficient higher than that of the center pad 108. As a result, when the center pad 108 is in contact with the top surface 191 of the POD 190, if the POD 190 is shifted in the horizontal direction, the friction member 105 is able to prevent the top surface 191 of the POD 190 and the center pad 108 from sliding to each other, thereby preventing damage to the top surface 191 of the POD 190.

Although the examples have been described above, this disclosure is not limited to the above examples.

In the above examples, as long as it is possible to detect the relative lifting operation of the center cone 8 with respect to the lifting platform 6, the height detecting unit 20 is not limited to the configuration described above. In the above examples, the container contact portion, if it is possible to come into contact with the top surface of the container, is not limited to center cone 8 and center pad 108, and containers other than the FOUP 90 and the POD 190 may be applied.

The above examples include the first magnet 93 and the second magnet 94 as the energizing portion configured to energize the container contact portion, but the energizing portion is not particularly limited. Various configurations may be employed as the energizing portion, as long as it is possible to energize the container contact portion. For example, a spring or rubber may be provided as an energizing portion, and its elasticity may be used to energize the container contact portion.

The materials and shapes of the respective configurations in the examples and the modifications above are not limited to those described above, and various materials and shapes can be used. Each configuration in the examples or the modifications above may be optionally applied to each configuration in other examples or modifications. Some of the respective configurations in the examples or the modifications above may be omitted as appropriate within the scope not departing from the spirit of appended claims.

The invention claimed is:

1. An overhead transport vehicle comprising:
    a lifting platform configured to transfer a container;
    a container contact portion configured to come into contact with a top surface of the container and movably provided along a height direction with respect to the lifting platform; and
    a height detecting unit configured to detect a relative height position of the container contact portion with respect to the lifting platform, wherein
    the container contact portion is movably provided along a horizontal direction with respect to the lifting platform.

2. The overhead transport vehicle according to claim 1, wherein the container contact portion is a positioning portion configured to fit into a recess formed in the top surface of the container.

3. The overhead transport vehicle according to claim 1, further comprising a sliding member attached to the lifting platform and slidable along the horizontal direction with respect to the container contact portion, wherein the container contact portion includes a housing space housing the sliding member.

4. The overhead transport vehicle according to claim 3, further comprising an energizing portion configured to energize the container contact portion such that the sliding member is positioned in a predetermined position in the housing space.

5. The overhead transport vehicle according to claim 4, wherein the energizing portion includes a first magnet provided in the sliding member and a second magnet provided in the container contact portion.

6. The overhead transport vehicle according to claim 3, further comprising a lid member, wherein the housing space is demarcated by opening a portion provided in the container contact portion and opened upward, and the lid member partially closes the opening of the opening portion.

7. The overhead transport vehicle according to claim 3, wherein a sheet member having friction coefficient smaller than that of the container contact portion is provided between the container contact portion and the sliding member.

8. The overhead transport vehicle according to claim 1, wherein the container contact portion comes into contact with the top surface of the container with a friction member interposed between the container contact portion and the top surface of the container, the friction member having friction coefficient higher than that of the container contact portion.

9. The overhead transport vehicle according to claim 1, wherein the container contact portion is movable with respect to the lifting platform in a first direction along the horizontal direction, and in a second direction along the horizontal direction and orthogonal to the first direction.

* * * * *